United States Patent
Nagayasu et al.

(10) Patent No.: US 6,347,126 B1
(45) Date of Patent: Feb. 12, 2002

(54) RECEIVER WITH A FREQUENCY OFFSET CORRECTING FUNCTION

(75) Inventors: Takayuki Nagayasu; Keishi Murakami, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/185,744

(22) Filed: Nov. 4, 1998

(51) Int. Cl.$^7$ ............................................. H04L 27/06
(52) U.S. Cl. ...................... 375/344; 375/326; 455/139; 455/184.1; 455/185.1
(58) Field of Search ............................... 375/344, 326, 375/316; 455/139, 164.1, 184.1, 185.1

(56) References Cited

U.S. PATENT DOCUMENTS

| | | | |
|---|---|---|---|
| 5,311,545 A | 5/1994 | Critchlow | 375/222 |
| 5,579,345 A | * 11/1996 | Kroeger et al. | 375/344 |
| 6,151,368 A | * 11/2000 | Cochran | 375/326 |

FOREIGN PATENT DOCUMENTS

| | | |
|---|---|---|
| EP | A10295226 | 12/1988 |
| JP | 8A-223096 | 8/1996 |
| WO | 90 07243 | 6/1990 |
| WO | 92 22155 | 12/1992 |

OTHER PUBLICATIONS

G. David Forney, Jr., "Maximum–Likelihood Sequence Estimation of Digital Sequences in the Presence of Intersymbol Interference," IEEE Transactions on Information Theory, vol. IT–18 No. 3, May 1972, pp. 363–378.

R.W. Lucky et al, IEEE Transaction on Information Theory, vol. IT–18, No. 3, May 1972, pp. 363–378.

W. Koch et al, Philips Kommunikations Industrie AG, Nurnberg, pp. 1679–1684.

* cited by examiner

Primary Examiner—Mohammad H. Ghayour

(57) ABSTRACT

Distortion of a received signal due to intersymbol interference as well as to frequency offset is corrected. For this reason, a frequency offset correcting circuit 21 corrects a received signal based on a frequency-offset estimated value. A first CIR estimating circuit 22 estimates CIR estimated values at a first position according to a known training sequence in the corrected received signal. Also, a second estimating circuit 24 updates the CIR estimated values with the LMS algorithm according to the corrected received signals as well as to the decision value outputted from the equalizer 13 with the CIR estimated values at the first position as initial values and obtains CIR estimated values at a second position apart from the first position. A phase deviation detecting circuit 15 computes phase deviations based on CIR estimated values at the first position as well as on CIR estimated values at the second position, and an averaging circuit 26 averages the phase deviations, and outputs the averaged value to the frequency offset correcting circuit 21 as a frequency-offset estimated value.

10 Claims, 11 Drawing Sheets

RECEIVER WITH A FREQUENCY OFFSET CORRECTING FUNCTION

TECHNICAL FIELD

The present invention relates to a receiver with a frequency offset correcting function used for radio digital data transfer such as that for an automobile telephone.

BACKGROUND ART

Prior to description of the prior art, description is made for a technological background concerning the present invention.

FIG. 14 shows a model of a channel with intersymbol interference (ISI) therein.

The model expresses a channel with a finite impulse response (FIR) filter. In the model, a received signal is a synthesized signal synthesized from a lead signal with the output thereof directly received and a delay signal with the output thereof received with a delay due to its reflection or so.

In the figure, a time difference between delay signals is given by a delay circuit DELAY comprising L-segmented shift register. The lead signal is obtained by multiplying a transmitted signal $I_n$ by channel impulse response (CIR) $c_{0,n}$ as a tap coefficient with a multiplier MULT0. Herein, a subscript n of CIR $c_{0,n}$ indicates a time of data received during TDMA communications.

Also, delay signals are obtained by multiplying delayed transmitted signals $I_{n-1}$ to $I_{n-L}$ by tap coefficients $c_{1,n}$ to $c_{L,n}$ with multipliers MULT1 to L respectively. Then, outputs of delay signals from the multipliers MULT0 to L are summed up by a summing device SUM, and an adder (ADD) adds noise $W_n$ to the summed wave outputted from the summing device (SUM) to output the added wave as a received signal $r_n$.

When intersymbol interference (ISI) is not present in the channel, the received signal $r_n$ is expressed with the following equation.

$$r_n = c_{0,n} I_n + W_n \qquad (1)$$

In this case, $c_{0,n}$ is a known value, so that a transmitted signal $I_n$ can easily be estimated from a received signal $r_n$ on condition that a noise $W_n$ is small.

By the way, according to the model in FIG. 14, when a transmitted sequence of $\{I_n\}$ is transmitted to the channel, this transmitted sequence undergoes intersymbol interference (ISI) in addition to additive white Gaussian noise $W_n$ in the channel. Accordingly, the received signal $r_n$ includes not only a time n but also a transmitting sequence $I_n$ in the past before that time. The received signal at this time is expressed with the following equation:

$$r_n = \Sigma c_{i,n} I_{n-i} + W_n \qquad (2)$$

wherein the sum $\Sigma$ is obtained for values of i=0, ..., L, and L indicates a time length affected by intersymbol interference (ISI), namely a channel memory length.

In the model of the channel shown in FIG. 14, the transmitted sequence $I_n$ includes a range from time n to time (n−L). An equalizer is often used for the channel described above as a device for estimating a transmitted sequence $I_n$ from a received signal $r_n$.

Also, when there is frequency offset $\Delta\omega$ generated due to a difference between a local oscillator of a transmitter and a local oscillator of a receiver, a received signal is expressed with the following equation:

$$r_n = \Sigma c_{i,n} I_{n-i} \exp(\Delta\omega n + \theta_0) + W'_n \qquad (3)$$

wherein $\theta_0$ is an initial phase, and $W'_n$ is expressed with the following equation:

$$W'_n = W_n \exp(\Delta\omega n + \theta_0) \qquad (4)$$

As described above, the performance of a receiver is deteriorated due to distortion caused by frequency offset $\Delta\omega$ in addition to intersymbol interference (ISI). And for this reason, the receiver needs to correct the intersymbol interference (ISI) and also the distortion caused by frequency offset $\Delta\omega$.

Next description is made for an example of a receiver with a frequency offset correcting function based on the conventional technology.

FIG. 15 is a block diagram showing the conventional type of receiver for correcting frequency offset. The receiver in this example is the same as that described in "Method and Device for Compensating Carrier Frequency Offset in TDMA Communication System (Japanese Patent Laid-open Publication No. HEI 6-508244)" disclosed by Lin Yuphan et al.

In FIG. 15, designated at the reference numeral 211 is a CIR estimating circuit for estimating CIR according to a training sequence in a received signal, at 212 a phase deviation detecting circuit for computing a phase deviation according to the CIR estimated value estimated by the CIR estimating circuit 211 and a tail bit described later of the received signal, at 213 an averaging circuit for averaging the phase deviations outputted from the phase deviation detecting circuit 212 and computing a frequency offset estimated value, at 214 a frequency offset correcting circuit for correcting the received signal $r_n$ according to the frequency offset estimated value outputted from the averaging circuit 213, and at 215 an equalizer for equalizing the received signal $r'_n$ corrected by the frequency offset correcting circuit 214 according to the CIR estimated value outputted from the CIR estimating circuit 211, andestimating the transmitted data sequence.

FIG. 16 shows a burst B1 of received signals received during TDMA communications based on the conventional technology shown in FIG. 15.

In the figure, this burst B1 comprises a training sequence B11, data sequence B12, B13, and tail bits B14, B15, and the training sequence B11 and the tail bits B14, B15 are known in the receiver side.

Next description is made for operations in the example based on the conventional technology with reference to FIG. 15 and FIG. 16.

At first, the CIR estimating circuit 211 computes, when having received a received signal $r_n$, CIR estimated values $g_0, g_1, \ldots, g_L$ according to the training sequence B11 in the received burst B1 as shown in FIG. 16 as well as to the training sequence having previously been known in the receiver side.

Then, the phase deviation detecting circuit 212 first computes a phase deviation $\phi_m$ with the following equation according to the CIR estimated values $g_0, g_1, \ldots, g_L$ estimated with the known training sequence in the received burst B1 by the CIR estimating circuit 211 as well as to the known tail bits $I_{n-L}, I_{n-L+1}, \ldots, I_n$. It should be noted that a subscript m in the equation indicates a phase deviation in m-th received burst.

$$s_n = \Sigma g_i I_{n-i} \quad (5)$$

$$\phi_m = \{Im[r_n] \cdot Re[s_n] - Im[s_n] \cdot Re[r_n]\} / \{ABS[r_n] \cdot ABS[s_n]\} \quad (6)$$

wherein the sum $\Sigma$ is obtained for $i=0, \ldots, L$. It should be noted that L indicates, as shown in the channel model in FIG. 14, a time length affected by intersymbol interference (ISI), namely a channel memory length, and corresponds to the number of stages in the delay circuit DELAY. Also, in the equation, designated at the reference sign $s_n$ is a replica (estimated value) of a received signal, at Re[a] a real part of a complex number a, at Im[a] an imaginary part of the complex number a, and at ABS[a] an absolute value of the complex number a respectively.

Further, the phase deviation detecting circuit 212 computes a phase deviation per symbol $\Delta\phi_m$ through the following equation according to the phase deviation $\phi_m$ as described above, and outputs a result of the computing to the averaging circuit 213.

$$\Delta\phi_m = \phi_m \{2/(M-1)\} \quad (7)$$

wherein M indicates a total number of symbols of a received burst B1.

Then, the averaging circuit 213 averages the phase deviation per symbol $\Delta\phi_m$ estimated for each burst B1, and outputs a result of averaging to the frequency offset correcting circuit 214 as a frequency-offset estimated value $\Delta\omega_m$.

The frequency offset correcting circuit 214 corrects frequency offset of a received signal $r_n$ through the following equation according to the frequency-offset estimated value $\Delta\omega_m$.

$$r'_n = r_n \exp(-j\Delta\omega_m n) \quad (8)$$

The equalizer 215 estimates transmitted data sequence according to the received signal $r'_n$ having been subjected to offset correction outputted from the frequency offset correcting circuit 214 as well as to the CIR estimated value outputted from the CIR estimating circuit 211, and outputs a result of the decision as a decision value.

However, in the receiver with the conventional type of frequency offset correcting function, known data such as tail bits other than the training sequence is required to compute a frequency-offset estimated value, and also a length of tail bits in a received signal is generally required to be longer than a memory length L of the channel, so that transmission efficiency is worse in turn by the length required for the tail bits.

In the example based on the conventional technology, a phase deviation is computed according to the CIR estimated value, the tail bits and the received signal, so that the phase deviation to be detected largely varies with noises. Accordingly, in order to estimate frequency offset with sufficient precision, it is required to suppress variation by making a time constant larger for averaging phase deviations, and for this reason, when frequency offset varies with time, it is difficult to follow the variation in the method described above.

Further, as diversity reception is not performed in the example based on the conventional technology, an error rate in decision is higher as compared to the case where diversity reception is performed.

The present invention has been made for solving the problems as described above, and it is an object of the present invention to provide a receiver with a frequency offset correcting function which has improved the capabilities of being excellent in transmission efficiency without requiring known data other than a training sequence, precisely estimating time-varying frequency offset, and further enabling performance of diversity reception and determination of data at a low error rate.

DISCLOSURE OF INVENTION

To achieve the object as described above, the present invention comprises a frequency offset correcting means for receiving a received signal as well as a frequency-offset estimated value and correcting phase rotation due to frequency offset of the received signal according to the frequency-offset estimated value; a first channel impulse response estimating means for estimating channel impulse response at a first position of the corrected received signal according to a known training sequence included in the received signal corrected by the frequency offset correcting means; a determining means for determining the received signal corrected by the frequency offset correcting means according to the channel impulse response estimated value at the first position thereof estimated by the first channel impulse response estimating means; a second channel impulse response estimating means for estimating channel impulse response at a second position apart from the first position of the corrected received signal according to the received signal corrected by the frequency offset correcting means, the channel impulse response estimated value at the first position thereof estimated by the first channel impulse response estimating means, and to the value determined by the determining means; and a frequency-offset estimated value computing means for computing a frequency-offset estimated value of the received signal according to the channel impulse response estimated value at the first position thereof estimated by the first channel impulse response estimating means as well as to the channel impulse response estimated value at the second position thereof estimated by the second channel impulse response estimating means, and outputting the computed value to the frequency offset correcting circuit. Therefore, with this invention, different channel-impulse estimated values at the first and second positions are obtained according to the training sequence having been known in the received signal, and a frequency-offset estimated value is computed according to those phase deviations, so that frequency offset of a received signal can be corrected and also data can be determined without using known data such as tail bits other than the training sequence. As a result, tail bits are not needed as a burst structure of a received signal, so that transmission efficiency is improved, and also a phase deviation can be computed not according to an estimated value (replica) of the received signal computed only with tail bits in a transmission sequence but according to channel impulse response estimated by sufficiently suppressing a noise element with an appropriate algorithm (e.g., LMS algorithm), and for this reason a phase deviation to be detected does not largely varies with noises, time-varying frequency offset can be compensated with high precision, and data can be determined at a low error rate.

The another present invention comprises a frequency offset correcting means for receiving a received signal as well as a frequency-offset estimated value and correcting phase rotation due to frequency offset of the received signal according to the frequency-offset estimated value; a first channel impulse response estimating means for estimating channel impulse response at a first position of the corrected received signal according to a known training sequence included in the received signal corrected by the frequency offset correcting means; a determining means for determining the received signal corrected by the frequency offset correcting means; a second channel impulse response estimating means for estimating channel impulse response at a second position apart from the first position of the corrected received signal by updating the channel impulse response estimated value at the first position according to the received signal corrected by the frequency offset correcting means, the channel impulse response estimated value at the first position thereof estimated by the first channel impulse response estimating means, and to the value determined by the determining means; and a frequency-offset estimated value computing means for computing a frequency-offset estimated value of the received signal according to the channel impulse response estimated value at the first position thereof estimated by the first channel impulse response estimating means as well as to the channel impulse response estimated value at the second position thereof estimated by the second channel impulse response estimating means, and outputting the computed value to the frequency offset correcting circuit; and the determining means determines the received signal corrected by the frequency offset correcting means, at first, according to the channel impulse response estimated value at the first position thereof estimated by the first channel impulse response estimating means, and determines the received signal corrected by the frequency offset correcting means, after the second time and on, according to a value updated from the channel impulse response estimated value at the first position thereof by the second channel impulse response estimating means. For this reason, with this invention, determination of the received signal after the second time and on is made according to values obtained, by successively updating the channel impulse response estimated value at the first position, outputted from the second estimating means, so that, even when the channel impulse response estimated value varies with time, the variation can be followed, and data can be determined at a low error rate.

The another present invention comprises a first channel impulse response estimating means for estimating channel impulse response at a first position of the received signal according to a known training sequence included in the received signal; a determining means for determining the received signal according to the channel impulse response estimated value at the first position thereof estimated by the first channel impulse response estimating means; a second channel impulse response estimating means for estimating channel impulse response at a second position apart from the first position of the received signal according to the received signal, the channel impulse response estimated value at the first position thereof estimated by the first channel impulse response estimating means, and to the value determined by the determining means; a frequency-offset estimated value computing means for computing a frequency-offset estimated value of the received signal according to the channel impulse response estimated value at the first position thereof estimated by the first channel impulse response estimating means as well as to the channel impulse response estimated value at the second position thereof estimated by the second channel impulse response estimating means; and a local oscillator correcting means for correcting a frequency from a local oscillator according to the frequency-offset estimated value computed by the frequency-offset estimated value computing means. Therefore, with this invention, a frequency from the local oscillator of the receiver is directly controlled in place of correcting frequency offset of the received signal, so that configuration of the circuit can be simplified.

The another present invention comprises a frequency offset correcting means for receiving a plurality of received signals as well as frequency-offset estimated value, and correcting each phase rotation due to frequency offset for the plurality of received signals according to the frequency-offset estimated value respectively; a first channel impulse response estimating means for estimating each channel impulse response at a first position of the plurality of corrected received signals according to each known training sequence included in the plurality of received signals corrected by the frequency offset correcting means; a determining means for determining the plurality of received signals corrected by the frequency offset correcting means according to the channel impulse response estimated values each at the first position thereof estimated by the first channel impulse response estimating means; a second channel impulse response estimating means for estimating each channel impulse response at a second position apart from the first position of the plurality of corrected received signals according to the plurality of received signals corrected by the frequency offset correcting means, each channel impulse response estimated value at the first position of the plurality of corrected received signals estimated by the first channel impulse response estimating means, and to the value of the plurality of received signals determined by the determining means; and a frequency-offset estimated value computing means for computing frequency-offset estimated value of the plurality of received signals according to each channel impulse response estimated value at the first position thereof estimated by the first channel impulse response estimating means as well as to each channel impulse response estimated value at the second position thereof estimated by the second channel impulse response estimating means, and outputting the computed value to the frequency offset correcting circuit. Therefore, with this invention, a plurality of received signals can be received with a plurality of frequency offset correcting circuits or the like respectively, so that diversity reception can be performed, and data can be determined at a low error rate.

In the present inventions, the frequency-offset estimated value computing means comprises a phase deviation detecting means for detecting a phase deviation between the first position and the second position according to the channel impulse response estimated value at the first position estimated by the first channel impulse response estimating means as well as to the channel impulse response estimated value at the second position estimated by the second channel impulse response estimating means; and an averaging means for averaging phase deviations obtained by computing a phase deviation per symbol according to the phase deviation between the first position and the second position detected by the phase deviation detecting means to compute a frequency-offset estimated value, and outputting the computed value to the frequency offset correcting circuit.

Also, the phase deviation detecting means selects a value of which the absolute value is the maximum among the channel impulse response estimated values at the first position estimated by the first channel impulse response estimating means, and also selects a value corresponding to the channel impulse response estimated value at the first position of which the absolute value is the maximum among the channel impulse response estimated values at the second position estimated by the second channel impulse response estimating means; and detects a phase deviation of the received signal according to the product of complex conjugate of the channel impulse response estimated value at the first position of which the absolute value is the maximum and the channel impulse response estimated value at the second position corresponding to the channel impulse response estimated value at the first position of which the absolute value is the maximum.

Also, the phase deviation detecting means computes each product of the complex conjugate of the channel impulse response estimated value at the first position estimated by the first channel impulse response estimating means and the channel impulse response estimated value at the second position estimated by the second channel impulse response estimating means, and detects a phase deviation of the received signal according to the sum of the products each of which the absolute value is more than a threshold value among the computed products.

Also, the phase deviation detecting means computes each product of the complex conjugate of the channel impulse response estimated value at the first position estimated by the first channel impulse response estimating means and the channel impulse response estimated value at the second position estimated by the second channel impulse response estimating means, selects each product of which the absolute value is more than a threshold value among the computed products, multiplies each of the absolute values to the selected products, and detects the phase deviation of the received signals according to the sum of the multiplied values.

Also, the phase deviation detecting means further quantizes the phase deviation of the detected received signal, and outputs a result of the quantization as a phase deviation.

Also, the determining means comprises a soft-decision equalizer for executing soft-decision of a data sequence in the corrected received signal according to the received signal corrected by the frequency offset correcting means as well as to the channel impulse response estimated value at the first position estimated by the first channel impulse response estimating means; and a hard-decision circuit for executing hard decision of the soft-decision value estimated by the soft-decision equalizer and outputting a result of the decision as a decision value of a data sequence in the received signal. Therefore, with this invention, decision can be made including reliability by the soft-decision equalizer, so that the reliability can be utilized in forward error correction and so on.

BEST MODE FOR CARRYING OUT THE INVENTION (1) Embodiment 1

At first, description is made for a receiver with a frequency offset correcting function according to Embodiment 1 of the present invention.

Figure 1:
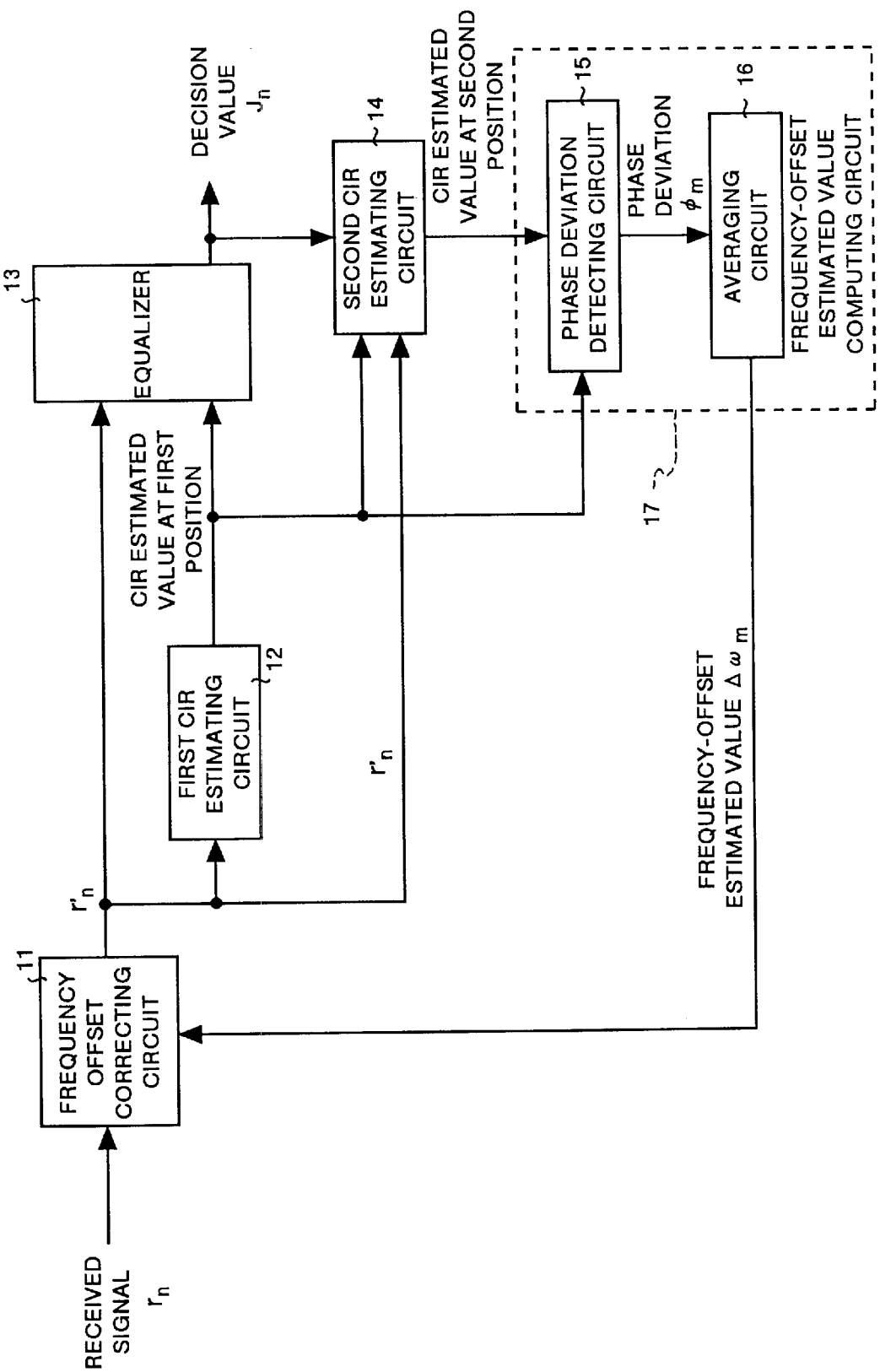
FIG. 1 is a block diagram showing configuration of a receiver with a frequency offset correcting function according to Embodiment 1 of the present invention.

FIG. 1 is a block diagram showing configuration of the receiver with the frequency offset correcting function according to Embodiment 1 of the present invention.

In the figure, designated at the reference numeral 11 is a frequency offset correcting circuit for correcting a received signal $r_n$ with a frequency-offset estimated value $\Delta\omega_m$ outputted from an averaging circuit 16 described later; at 12 a first CIR estimating circuit for estimating CIR at a first position on a burst according to a training sequence in a received signal $r'_n$ corrected by the frequency offset correcting circuit 11; at 13 an equalizer as a determining means for equalizing the received signal $r'_n$ corrected by the frequency offset correcting circuit 11 according to the CIR estimated value at the first position estimated by the first CIR estimating circuit 12, and outputting the decision value $J_n$; at 14 a second CIR estimating circuit for estimating a CIR estimated value at a second position apart from the first position on the burst in a corrected received signal $r'_n$ according to the received signal $r'_n$ corrected by the frequency offset correcting circuit 11, the CIR estimated value at the first position estimated by the first CIR estimating circuit 12, and to a result of decision by the equalizer 13; at 15 a phase deviation detecting circuit for computing a phase deviation according to the CIR estimated value at the first position estimated by the first CIR estimating circuit 12 as well as to the CIR estimated value at the second position estimated by the second CIR estimating circuit 14; and at 16 an averaging circuit for averaging the phase deviations detected by the phase deviation detecting circuit 15 and computing a frequency offset estimated value. It should be noted that the phase deviation detecting circuit 15 and averaging circuit 16 constitute a frequency-offset estimated value computing circuit 17.

Figure 2:
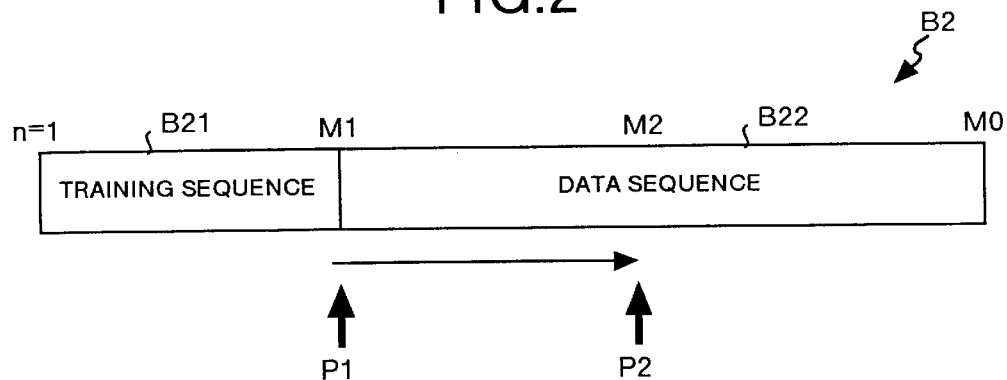
FIG. 2 is a view showing a burst structure of the received signal in Embodiment 1.

FIG. 2 shows a burst B2 of the received signal $r_n$ in Embodiment 1.

Figure 16:
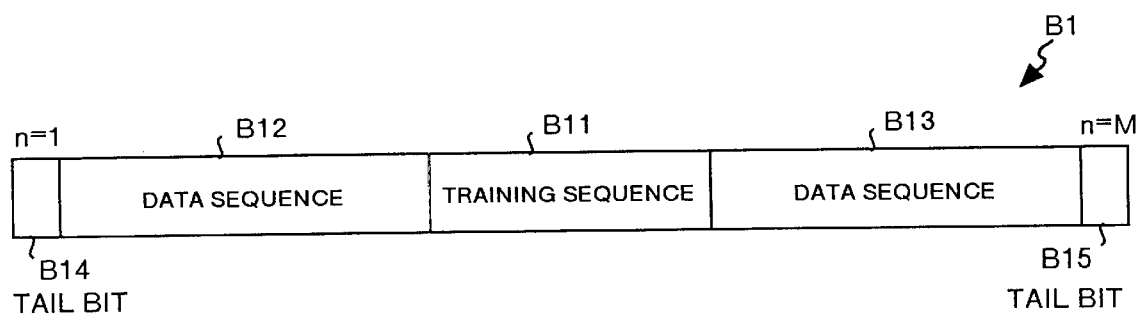
FIG. 16 is a view showing a burst structure of a received signal in the example based on the conventional technology.

In the figure, the burst B2 of the received signal $r_n$ in Embodiment 1 comprises a training sequence B21 known in the receiver and data sequence B22, and does not include tail bits different from the burst B1 having been described in the conventional technology shown in FIG. 16.

In the figure, designated at the reference sign n is a time, at P1 a time M1, namely a first position indicating a symbol of the time corresponding to a final symbol of the training sequence B21 in the burst B2, at P2 a second position indicating a symbol of a time M2, and M0 is a time indicating a length of all the symbols in this burst B2.

It should be noted that the burst B2 may also include tail bits similarly to the case of the burst B1 based on the conventional technology, but the present invention has eliminated the need for tail bits because frequency offset of a received signal is computed and corrected only based on the training sequence without using the tail bits.

Next description is made for operations of the receiver with a frequency offset correcting function configured as described above according to Embodiment 1. Further, it is assumed that the burst B2 is received as received signal shown in FIG. 2.

At first, the frequency offset correcting circuit 11 corrects a received signal $r_n$ at a time m−1 one time interval before the time m as described later based on the frequency-offset estimated value $\Delta\omega_{m-1}$ having been estimated by the averaging circuit 16 through the following equation.

$$r'_n = r_n \exp(-j\Delta\omega_{m-1} n) \quad (9)$$

Then, the first CIR estimating circuit 12 computes CIR estimated values $g_{0,n}, g_{1,n}, \ldots, g_{L,n}$ with an LMS (Least Mean Square) algorithm according to the known training sequence $I_n$ as well as to the training sequence B21 in the corrected received signal $r'_n$. It should be noted that the LMS algorithm is as follows:

$$g_{i,n} = g_{i,n-1} + \alpha\{r'_n - \Sigma g_{j,n-1} I_{n-j}\} I_{n-i}^* \quad (10)$$

wherein i and n indicate as follows: i=0, ..., L, and n=L+1, ... M1. Also, the sum Σ is obtained for j=0, ..., L, and the reference sign a * indicates a complex conjugate of a complex number a. The reference sign a indicates a step size of the LMS algorithm, and initial values $g_{0,L}, g_{1,L}, \ldots g_{L,L}$ of the CIR estimated values are set to arbitrary values respectively.

Figure 14:
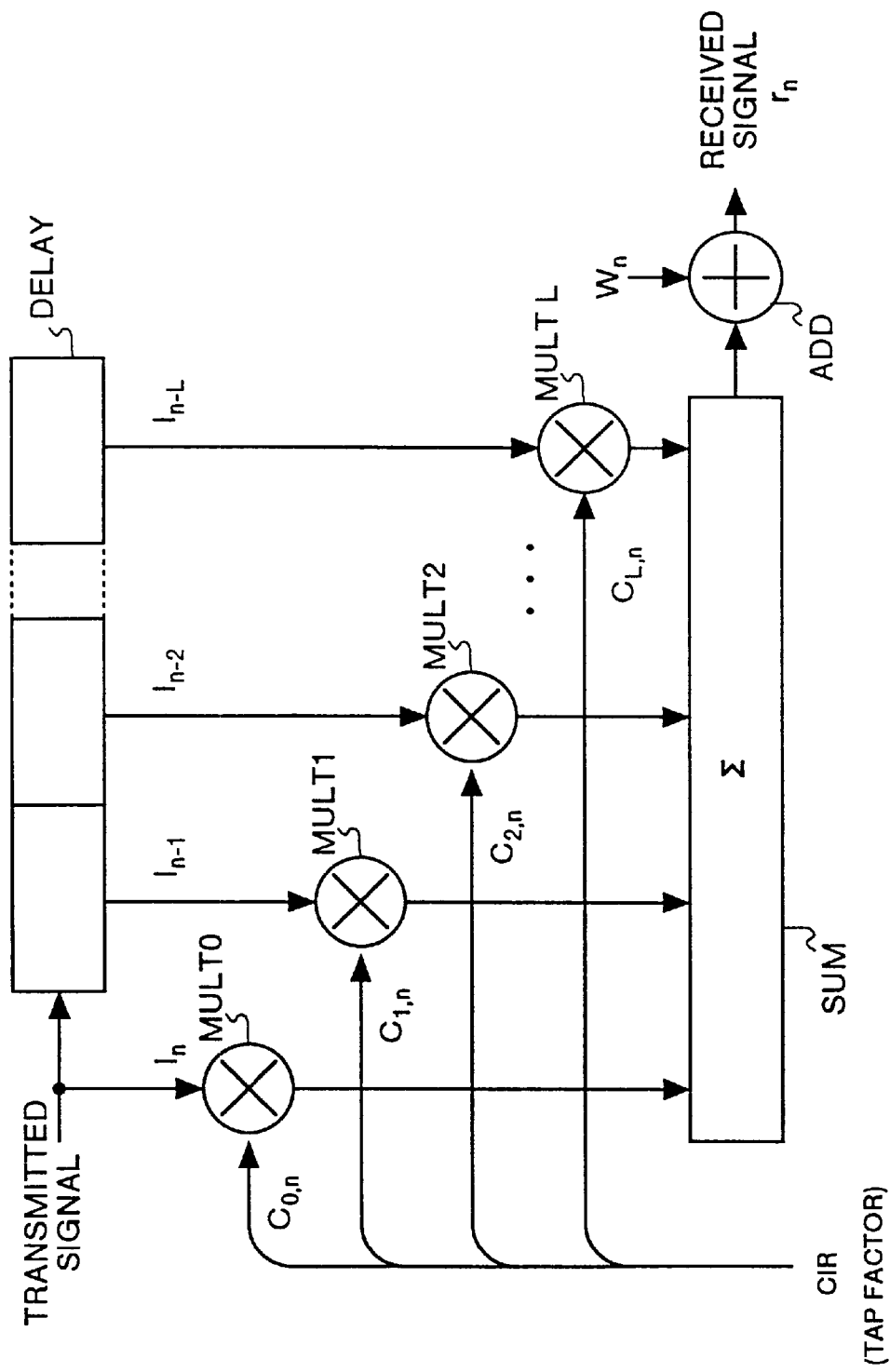
FIG. 14 is a block diagram showing a model of a channel with intersymbol interference (ISI) therein.
Figure 15:
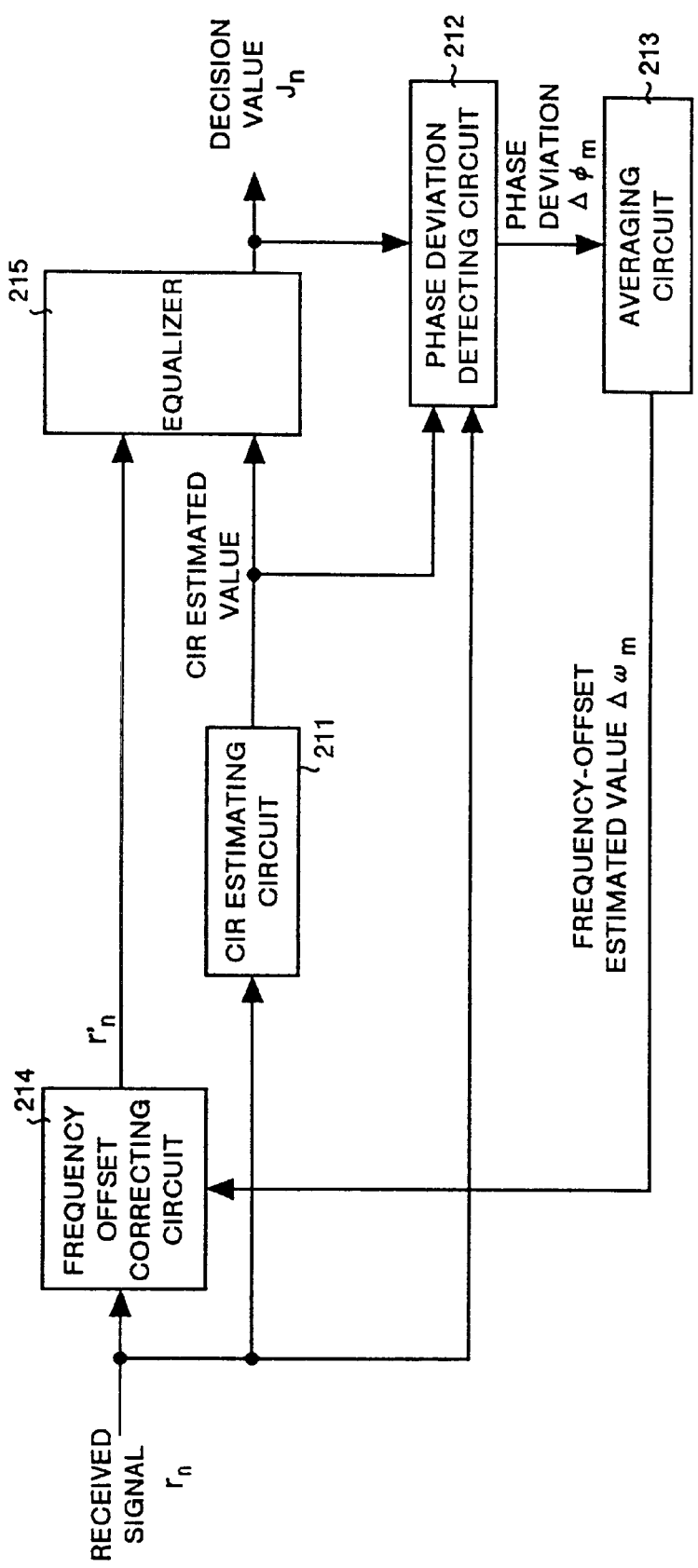
FIG. 15 is a block diagram showing configuration of the receiver with a frequency offset correcting function based on the conventional technology.

It should be noted that the reference sign L indicates, as described in the conventional technology, a time length affected by intersymbol interference (ISI) in the transmission model in FIG. 14, namely a channel memory length. The reference sign M1 indicates a time corresponding to the final symbol of the training sequence in the burst B2 and is a first position where the first CIR is estimated.

Then, the equalizer 13 determines a data sequence according to the CIR estimated values $g_{0, M1}, g_{1, M1}, \ldots, g_{L, M1}$ outputted from the first CIR estimating circuit 12 as well as to the corrected received signal $r'_n$, and outputs a result of the decision as a decision value $J_n$. It should be noted that the decision value $J_n$ indicates not a decision value outputted at the time n but a decision value corresponding to the transmitted signal $I_n$. Namely, $J_n$ will be equal to $I_n$ on condition that appropriate decision is made.

Then, the second CIR estimating circuit 14 updates the CIR estimated values $g_{0,n}, g_{1,n}, \ldots, g_{L,n}$ with the LMS algorithm according to the corrected received signal $r'_n$ as well as to the decision value in outputted from the equalizer 13 with the CIR estimated values $g_{0,M1}, g_{1,M1}, \ldots, g_{L,M1}$, as initial values, at the first position P1 in the burst B2 outputted from the first CIR estimating circuit 12, namely at the time M1 corresponding to the final symbol of the training sequence B21 in the burst B2 as shown in FIG. 2; estimates CIR estimating values $g_{0,M2}, g_{1,M2}, \ldots g_{L,M2}$ at the second position P2 which is apart from the first position, namely at the time M2 apart from the time M1 corresponding to the final symbol of the training sequence B21 in the burst B2 as shown in FIG. 2; and outputs the estimated values to the phase deviation detecting circuit 15. It should be noted that the CIR estimated values $g_{0,n}, g_{1,n}, \ldots, g_{L,n}$ with the LMS algorithm are updated with the following equation:

$$g_{i,n} = g_{i,n-1} + \alpha\{r'_n - \Sigma g_{j,n-1} J_{n-j}\} J_{n-i}^* \quad (11)$$

wherein i and n indicate as follows: i=0, ..., L, and n=M1+1, ... M2. Also, the sum Σ is obtained for j=0, ..., L. As for $J_n$ in n≦M1, the training sequence $I_n$ is used in place of the decision value $J_n$.

The phase deviation detecting circuit 15 detects, when having received a CIR estimated value at the second position P2 from the second CIR estimating circuit 14, a phase deviation according to the sequence described below.

Namely, at first, any CIR estimated value of which the absolute value is maximum is selected as a tap coefficient among the CIR estimated values $g_{0, M1}, g_{1, M1}, \ldots, g_{L, M1}$ at the first position on the burst B2 outputted from the first CIR estimating circuit 12. Herein, it is assumed that a CIR estimated value of which the absolute value is maximum is a tap coefficient $g_{Max,M1}$.

Also, the CIR estimated value $g_{i, M2}$ corresponding to the tap coefficient $g_{Max,M1}$, namely i of which is the same as that of $g_{Max,M1}$, is selected as a tap coefficient $g_{Max,M2}$ among the CIR estimated values $g_{0,M2}, g_{1,M2}, \ldots, g_{L,M2}$ at the second position apart from the first position on the burst B2 outputted from the second estimating circuit 14, and a phase deviation $\Phi_m$ on a complex plane is computed with the following equation:

$$\Phi_m = g_{Max, M2} g_{Max, M1}^* \quad (12)$$

Then, the phase deviation $\Phi_m$ on the complex plane is converted to a phase deviation $\phi_m$ on polar coordinates with the following equation:

$$\phi_m = Im[\Phi_m]/Re[\Phi_m] \quad (13)$$

Then, the averaging circuit 16 divides the phase deviation $\phi_m$ outputted from the phase deviation detecting circuit 15 by (M2−M1) to compute the phase deviation $\Delta\phi_m$ per symbol.

$$\Delta\phi_m = \phi_m/(M2-M1) \quad (14)$$

Further, the averaging circuit 16 averages the phase deviation $\Delta\phi_m$ per symbol obtained as described above with a FIR filter expressing with the first term of the following equation, and outputs a result of equation (15) as a frequency-offset estimated value $\Delta\omega_m$ to the frequency offset correcting circuit 11:

$$\Delta\omega_m = \Sigma\Delta\phi_{m-j}/Q + \Delta\omega_{m-1} \quad (15)$$

wherein the sum Σ is obtained for j=1, ..., Q. It should be noted that Q is the number of samples of $\Delta\phi_{m-j}$ when the values $\Delta\phi_{m-j}$ are averaged with the FIR filter. That is because each of the values $\Delta\phi_{m-j}$ is displaced from the actual value due to fading and noises, so that the values $\Delta\Phi_{m-j}$ estimated at different times are averaged to reduce the displacement from the actual value. For this reason, the larger the value of Q is, the smaller the variation of $\Delta\omega_m$ is, and for this reason, a stable value can be obtained, but actually, when an amount of frequency offset varies with time, response to the variation may be delayed, performance of tracking the variation to a degree of fluctuation of $\Delta\omega_m$ can be affected depending on the value of Q, so that, in this case, the value of Q should not be so large.

Then, the frequency offset correcting circuit 11 corrects a received signal $r_n$ according to a frequency-offset estimated value $\Delta\omega_m$ from the averaging circuit 16 through the equation (9).

As described above, with Embodiment 1 of the present invention, frequency offset is estimated without using known data such as tail bits other than the training sequence, and data can be determined while distortion of the frequency offset is compensated, so that the need for the known data such as tail bits other than the training sequence can be eliminated, transmission efficiency can be improved, and there is no need for suppressing variation by making a time constant larger for averaging a phase deviation to estimate frequency offset with sufficient precision, and for this reason, even when frequency offset varies with time, the variation can easily be followed, and time-varying frequency offset can be estimated with high precision.

Also, in Embodiment 1, a phase deviation is detected based on a CIR estimated value at the first position P1 estimated according to the known training sequence and a training sequence in a received signal as well as on a CIR estimated value at the second position P2 apart from the first position obtained by updating this CIR estimated value at the first position with the LMS algorithm, so that, by making a step size of the LMS algorithm smaller, CIR estimated values at both of the first position and the second position in which noise elements included in the received signal are sufficiently suppressed can be obtained, and frequency offset can be corrected with frequency-offset estimated values having less noise element.

As a result, in Embodiment 1, a phase deviation can precisely be detected, which allows a time constant for averaging to be made smaller and time-varying frequency offset to be estimated with high precision.

It should be noted that detailed description is not made for operations of the equalizer 13 in Embodiment 1 of the present invention because the invention is not in relation to the equalizer 13 itself as a determining means, but there is one example of the operations of an equalizer as described in detail with maximum-likelihood sequence estimation (MLSE) disclosed in "Maximum-likelihood sequence estimation of digital sequence in presence of intersymbol interference" by G. D. Forney, Jr. (IEEE trans. Information Theory, vol. IT-18, pp. 363–378, May 1972).

As the equalizer 13, a non-linear equalizer and a linear equalizer such as a decision-feedback equalizer may be used.

Also, in addition to the LMS algorithm, a RLS (Recursive Least Squares) algorithm and modified algorithms of the LMS algorithm and the RLS algorithm may be used for updating of the CIR estimated values by the second estimating circuit 14.

Also, in Embodiment 1, although the phase deviation $\Delta\phi_m$ per symbol is computed in the averaging circuit 16, a computing method can also be changed so that the phase deviation $\Delta\phi_m$ per symbol is computed in the phase deviation detecting circuit 15 like in the conventional technology. The computing method can also be changed so that a frequency-offset estimated value $\Delta\omega_m$ is computed by averaging a phase deviation $\phi_m$ in the averaging circuit 16 and dividing a result of the averaging by (M2−M1)

Figure 3:
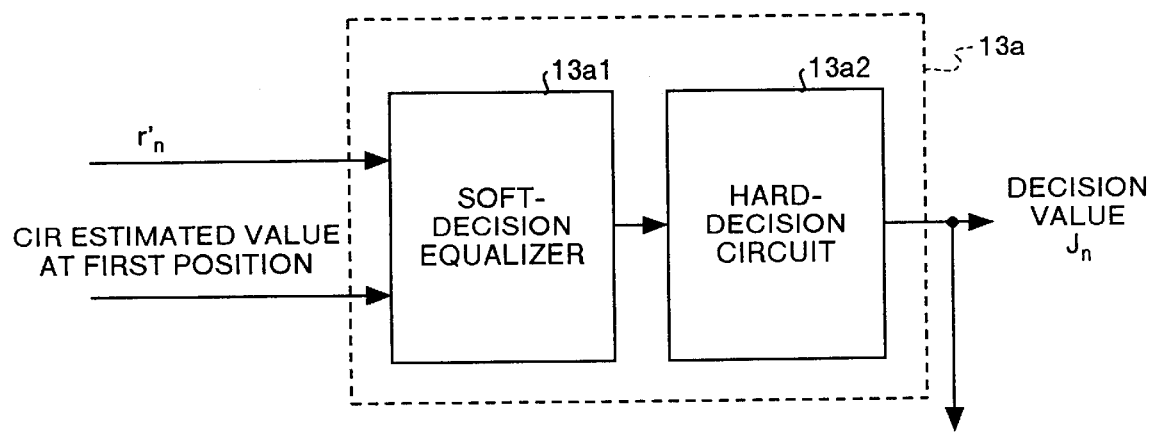
FIG. 3 is a view showing configuration of a determining circuit 13a having an equalizer for executing soft-determination in place of equalizer 13.

Also, in Embodiment 1, in place of the equalizer 13 as a decision means, as shown in FIG. 3, a decision circuit 13a comprising a combination of a soft-decision equalizer 13a1 for outputting soft-decision value with a hard-decision circuit 13a2 for hard-decision a soft-decision value described in "Optimum and sub-optimum detection of coded data distributed by time-varying intersymbol interference (IEEE GLOBECOM' 90, San Diego, pp. 1679–1685, December 1990) by W. Koch et al. or the like may be provided.

Herein, although detailed description is not made for the soft-decision equalizer because the present invention is not made for the soft-decision equalizer itself, the equalizer 13 in Embodiment 1 determines which of 1 and −1 is transmitted from a received signal, what is called, makes hard decision, while the soft-decision equalizer 13a1 calculates soft-decision values by assigning weights to decision values by reliability, and a result of the decision is outputted at multivalues such as 1.2, 0.3, and −0.5. Then, the hard-decision circuit 13a2 makes hard-decision, namely determines which of 1 and −1 the transmitted signal is in the case described above according to the decision output from the soft-decision equalizer 13a1 and outputs a decision value $J_n$.

Also, in Embodiment 1, the second CIR estimating circuit 14 updates a CIR estimated value at the first position which is the time M1 estimated by the first CIR estimating circuit 12 according to the decision value $J_n$ obtained from n=M1+1∼M2 in the burst B1 shown in FIG. 2, estimates a CIR estimated value at the second position apart from the first position, namely the time M2, and a phase deviation of the received signal is computed from the two CIR estimated values, but in the present invention, a phase deviation may be computed by estimating CIR estimated values at the first and second positions with the methods shown in FIG. 4 to FIG. 9 described later.

Figure 4:
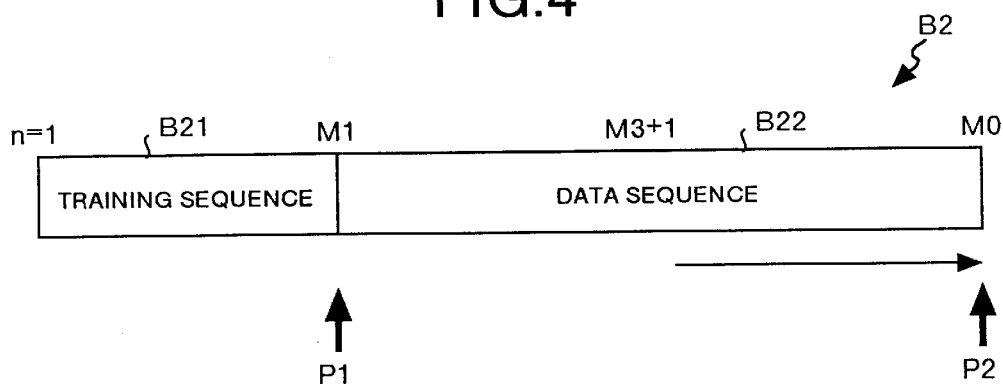
FIG. 4 is a view showing another method of computing a CIR estimated value at the second position.

Specifically, as shown in FIG. 4, the first position where the first CIR estimating circuit 12 estimates a CIR estimated value is the time M1 of the final symbol of the training sequence B21, which is not changed, but the second CIR estimating circuit 14 may compute a phase deviation according to the first CIR estimated value and the second CIR estimated value by updating a CIR estimated value according to a decision value $J_n$ obtained from n=M3+1∼M0 with CIR estimated values $g_{0, M1}, g_{1, M1}, \ldots, g_{L, M1}$ at the first position P1 at the time M1 estimated by the first CIR estimating circuit 12 as initial values, regarding the time M0, namely the final symbol position of the data sequence B22 in the burst B2 as the second position P2, and estimating a CIR estimated value at the second position P2 thereof.

Figure 5:
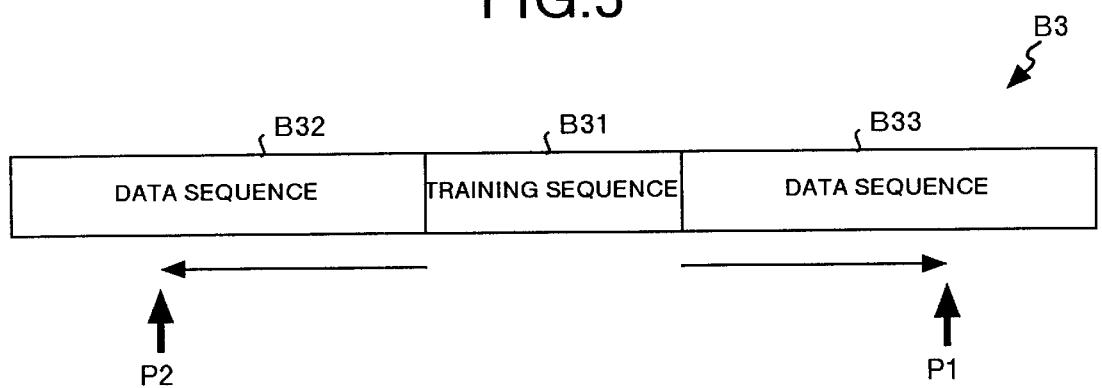
FIG. 5 is a view showing another method of computing a CIR estimated value.

As shown in FIG. 5, in a case of the burst B3 with its structure comprising a training sequence B31 and data sequence 32 and 33, a CIR estimated value at the second arbitrary position P2 in the data sequence B32 may be computed through the same processing as that in Embodiment 1 by obtaining a CIR estimated value at a first arbitrary position in the data sequence B33 by means of the same processing as that in Embodiment 1 according to the CIR estimated value at the time of the final symbol in the training sequence B31 and reversing the series on its time axis according to the CIR estimated value at the time of a header symbol in the training sequence B31.

It should be noted that, in this case of the burst B3, a phase deviation may also be computed by using only the training sequence B31 and data sequence B33 with the CIR estimated value at the first position which is a time corresponding to the final symbol of the training sequence B31 as well as with the CIR estimated value at the second arbitrary position of the training sequence B31 by means of the same processing as that in Embodiment 1 shown in FIG. 2.

Figure 6:
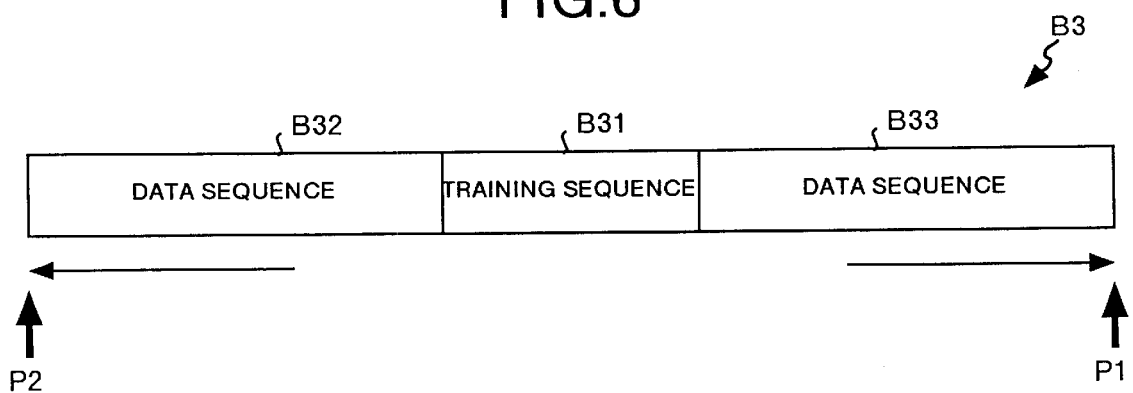
FIG. 6 is a view showing another method of computing a CIR estimated value.

As shown in FIG. 6, in a case of the burst B3 comprising the training sequence B31 and the data sequence 32 and 33 which are the same as those shown in FIG. 5, for the training sequence B31 and the data sequence 33, a position of the final symbol in the data sequence B33 is regarded as the first position P1 and a CIR estimated value may be computed at the position through the same processing as that in FIG. 3, and also for the training sequence B31 and data sequence B32, a position of the header symbol in the data sequence B32 is also regarded as the second position P2 and a CIR estimated value may be computed through the same processing as that in FIG. 3 by reversing the sequence on its time axis.

It should be noted that, in this case of the burst B3, a phase deviation may also be computed by using only the training sequence B31 and data sequence B33 through the same processing as the method described in Embodiment 1 shown in FIG. 2 and the method shown in FIG. 4.

Figure 7:
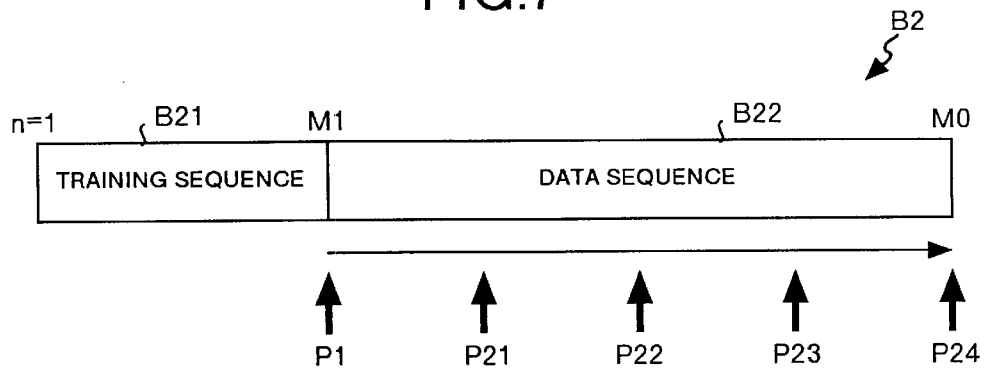
FIG. 7 is a view showing another method of computing a CIR estimated value.

As shown in FIG. 7, in a case of the burst B2 comprising the training sequence B21 and the data sequence B22, CIR estimated values at a plurality of the second positions such as positions P21 to P24 are computed based on the CIR estimated value at the first position P1 through the same processing as that in Embodiment 1, each phase deviation is obtained with the CIR estimated values at adjacent positions to each other, and the average value of those phase deviations may be outputted to the averaging circuit 16 as a result of the phase deviations. In this case, even when the burst B2 comprising the training sequence B21 and the data sequence B22 shown in FIG. 7 is used, a plurality of phase deviations are obtained, the plurality of phase deviations are averaged, and the averaged value is outputted to the averaging circuit 16 as a phase deviation, so that a more accurate phase deviation of a received signal can be obtained.

Figure 8:
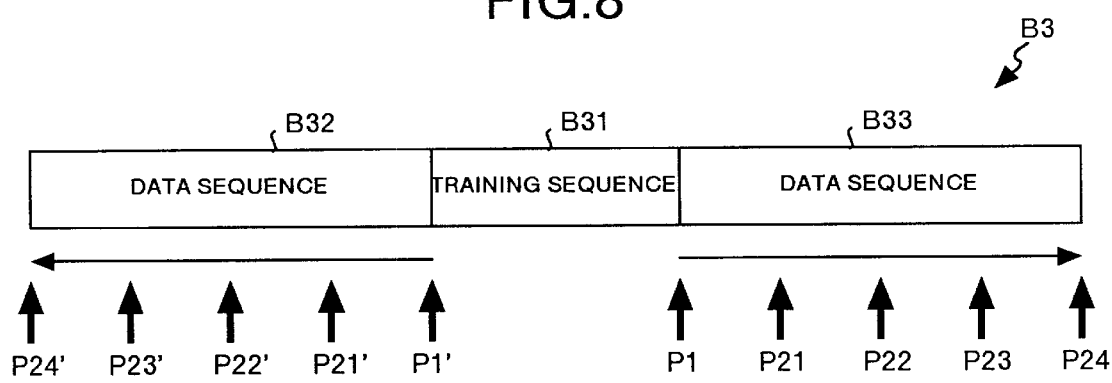
FIG. 8 is a view showing another method of computing a CIR estimated value.

As shown in FIG. 8, in a case of the burst B3 comprising the training sequence B31 and the data sequence B32 and B33, CIR estimated values, for instance, at the plurality of positions P21 to P24 in the data sequence B33 are obtained and CIR estimated values, for instance, at the plurality of positions P21' to P24' in the data sequence B32 are obtained by regarding the header or the tail of the training sequence B31 as each of the first positions P1 and P1' and based on the CIR estimated values at the positions, a plurality of phase deviations are obtained from the CIR estimated values at the adjacent position to each other, the plurality of phase deviations are averaged, and the averaged value may be outputted to the averaging circuit 16 as a phase deviation. In this case, even when the burst B3 comprising the training sequence B31 and the data sequence B32 and B33 is used, similarly to the case shown in FIG. 7, a plurality of phase deviations are obtained, the plurality of phase deviations are averaged, and the averaged value is outputted to the averaging circuit 16 as a phase deviation, so that a more accurate phase deviation of a received signal can be obtained.

Figure 9:
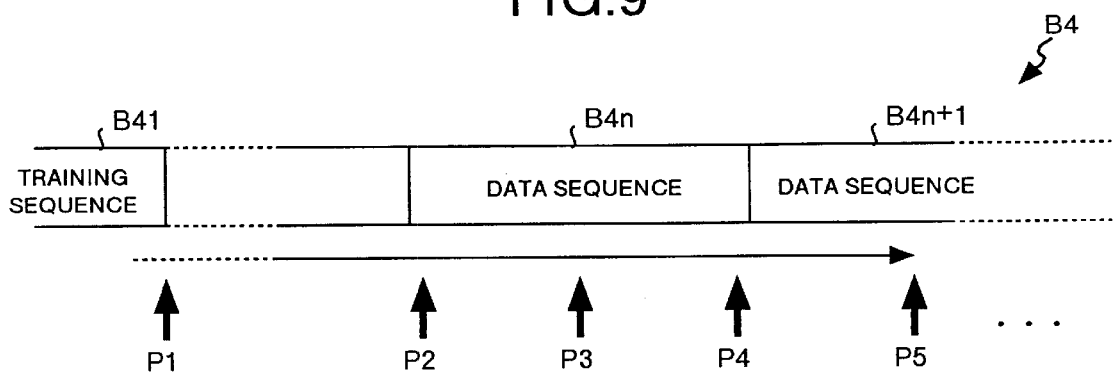
FIG. 9 is a view showing another method of computing a CIR estimated value.

In a case of a burst B4 in which data sequence as shown in FIG. 9 are continued, a CIR estimated value at the position P1 of the known training sequence B41 is obtained similarly to the case in Embodiment 1 shown in FIG. 2, CIR estimated values at a plurality of positions such as positions P2 to P5 are computed based on the CIR estimated value at the first position P1, a plurality of phase deviations are obtained from the CIR estimated values at adjacent positions to each other, the plurality of phase deviations are averaged, and the average value may be outputted to the averaging circuit 16 as a phase deviation. In this case, even when the burst B4 with the data sequence continued as shown in FIG. 9 is used, similarly to the case in the Embodiment 1, a plurality of phase deviations are obtained, the plurality of phase deviations are averaged, and the averaged value is outputted to the averaging circuit 16 as a phase deviation, so that a more accurate phase deviation of a received signal can be obtained.

Also, the phase deviation detecting circuit 15 may detect a phase deviation according to the method as described below.

Specifically, at first, with regard to a combination of CIR estimated values $g_{0,M1}, g_{1,M1}, \ldots, g_{L,M1}$ outputted from the first CIR estimating circuit 12 with CIR estimated values $g_{0,M2}, g_{1,M2}, \ldots, g_{L,M2}$ outputted from the second CIR estimating circuit 14, phase deviation $\Phi_{i,m}$ on a complex plane is computed with the following equation:

$$\Phi_{i,m} = g_{i,M2} \cdot g_{i,M1}^* \quad (16)$$

wherein i indicates as follows: i=0, . . . , L.

Then, phase deviations each in which $ABS[\Phi_{i,m}]$ as absolute values of the phase deviation $\Phi_{i,m}$ is more than a certain threshold value are selected, and the sum thereof is a phase deviation $\Phi_{SUM,m}$ on the complex plane:

$$\Phi_{SUM,m} = \Sigma \Phi_{i,m} \quad (17)$$

wherein, the sum $\Sigma$ of the equation (17) is obtained, as described above, for phase deviations $\Phi_{i,m}$ each of which $ABS[\Phi_{i,m}]$ is more than the threshold value. Then, a phase deviation $\Phi_{SUM,m}$ on the complex plane is converted to a phase deviation $\phi_m$ on polar coordinates with the following equation:

$$\phi_m = Im[\Phi_{SUM,m}]/Re[\Phi_{SUM,m}] \quad (18)$$

The phase deviation detecting circuit 15 according to Embodiment 1 may detect a phase deviation according to the method as described below.

Specifically, at first, with regard to a combination of CIR estimated values $g_{0,M1}, g_{1,M1}, \ldots, g_{L,M1}$ outputted from the first CIR estimating circuit 12 with CIR estimated values $g_{0,M2}, g_{1,M2}, \ldots, g_{L,M2}$ outputted from the second CIR estimating circuit 14, phase deviation $\Phi_{i,m}$ on a complex plane is computed with the following equation:

$$\Phi_{i,m} = g_{i,M2} \cdot g_{i,M1}^* \quad (19)$$

wherein i indicates as follows: i=0, . . . , L.

Then, phase deviations $\Phi_{i,m}$ each in which $ABS[\Phi_{i,m}]$ as absolute values of the phase deviation $\Phi_{i,m}$ is more than a specified threshold value are selected, and the sum by assigning weights to the phase deviations with the absolute values $ABS[\Phi_{i,m}]$ is a phase deviation $\Phi_{COM,m}$ on the complex plane as shown in the following equation. With those operations, weights are assigned to the phase deviations $\Phi_{i,m}$ with the absolute values $ABS[\Phi_{i,m}]$ thereof, so that a more accurate phase deviation can be obtained.

$$\Phi_{COM,m} = \Sigma ABS[\Phi_{i,m}] \cdot \Phi_{i,m} \quad (20)$$

wherein the sum $\Sigma$ of the equation (20) is obtained, as described above, for phase deviations each of which $ABS[\Phi_{i,m}]$ is more than the threshold value. Then, a phase deviation $\Phi_{COM,m}$ on the complex plane is converted to a phase deviation $\Phi_m$ on polar coordinates with the following equation:

$$\phi m = Im[\Phi_{COM,m}]/Re[\Phi_{COM,m}] \quad (21)$$

It should be noted that the equations (13), (18), and (21) executed by the phase deviation detecting circuit 15 can also be computed more accurately by being substituted in the following equation:

$$\phi_m = \arctan(Im[\Phi_m]/Re[\Phi_m]) \quad (22)$$

Figure 10:
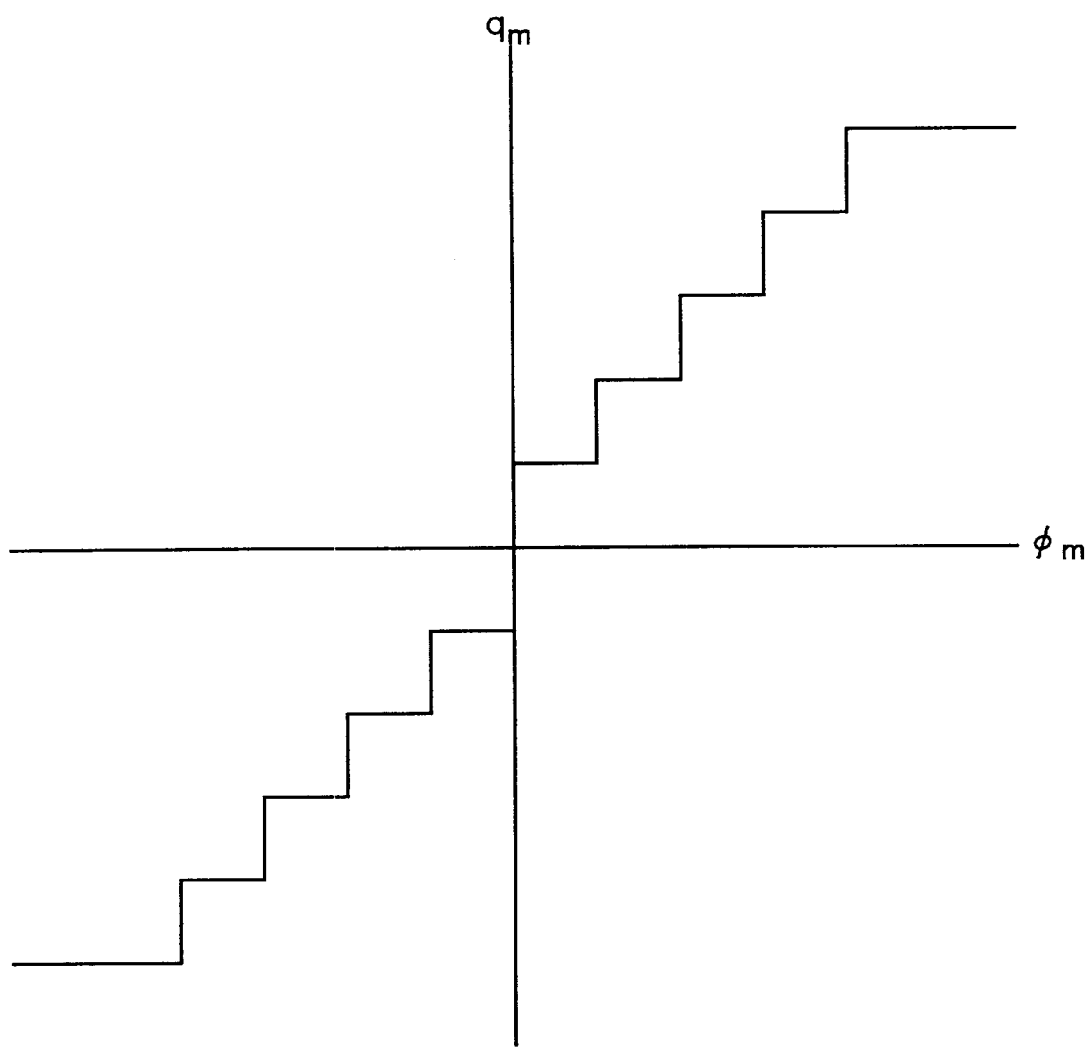
FIG. 10 is a view showing a graph of a quantizing function.

Further, the phase deviation detecting circuit 15 quantizes a phase deviation $\Phi_m$ with a function in which a quantized phase deviation $q_m$ is changed step by step according to changes for each specified rate of the phase deviation $\Phi_m$ as shown in FIG. 10, and may also output a result of quantization to the averaging circuit 16 in place of the phase deviation $\Phi_m$ as a quantized phase deviation $q_m$.

Also, an IIR filter, a random walk filter or an N-Before-M filter other than the FIR filter can be used for averaging in the averaging circuit 16.

Further, the averaging circuit 16 outputs control data for correction of frequency offset in place of outputting a frequency-offset estimated value, and can correct the frequency offset of the received signal in the frequency offset correcting circuit 11 based on the control data.

In the first CIR estimating circuit 12, in addition to the LMS algorithm, the RLS algorithm and modified algorithms of the LMS algorithm and the RLS algorithm may be used. Further, a CIR estimated value can be computed based on a correlation between a training sequence and a training sequence in the received signal. However, when computing is carried out by using the correlation, the CIR estimated value computed with the training sequence is a value at the center of the training sequence.

The configuration of Embodiment 1 may be realized with firmware such as DSP, hardware software.

Also, the change in design as described above is also applicable to those in Embodiments 2 to 4 described below in addition to Embodiment 1.

(2) Embodiment 2

Next description is made for a receiver with a frequency offset correcting function according to Embodiment 2 of the present invention.

Figure 11:
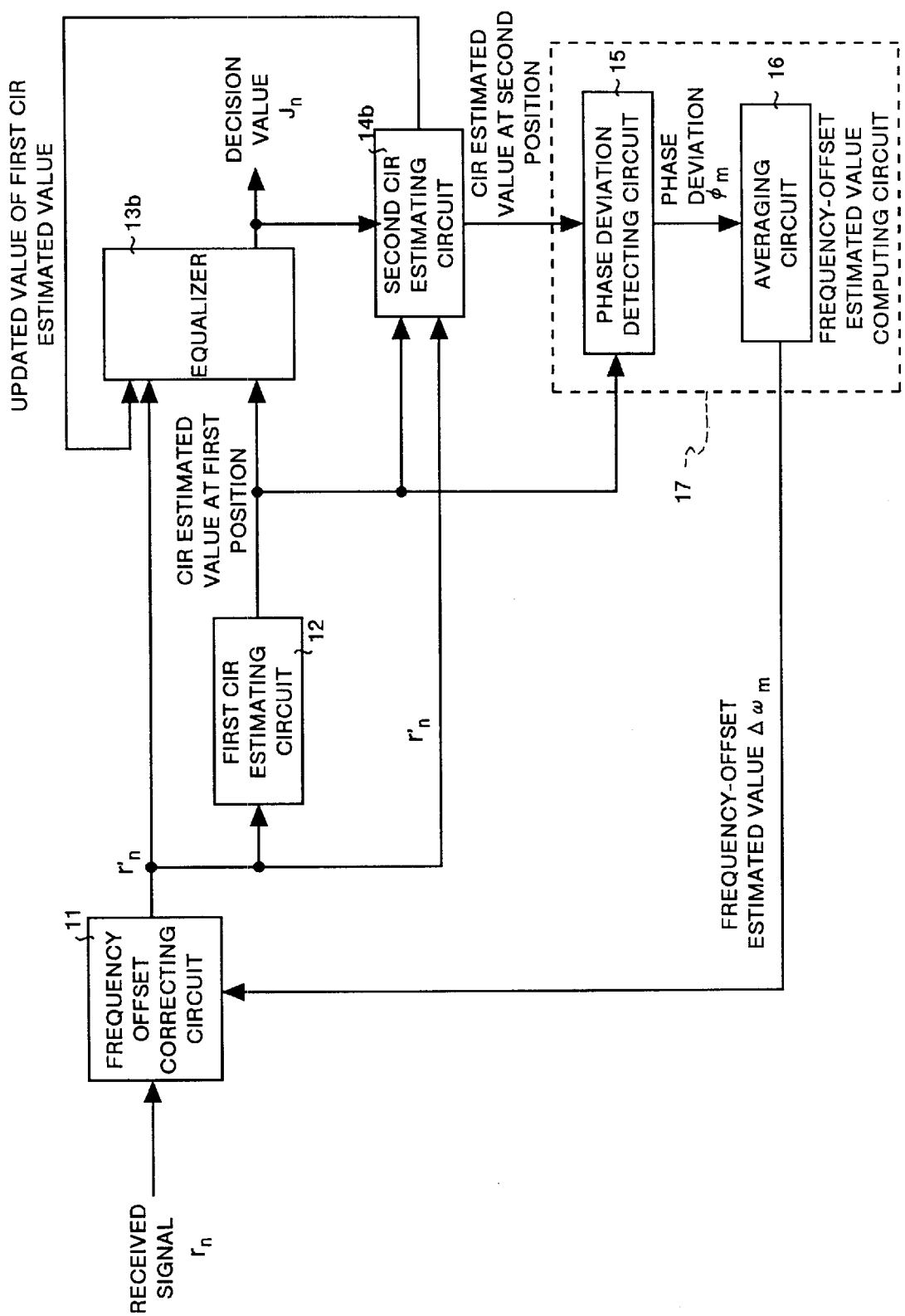
FIG. 11 is a block diagram showing configuration of a receiver with a frequency offset correcting function according to Embodiment 2 of the present invention.

FIG. 11 shows configuration of the receiver with a frequency offset correcting function according to Embodiment 2. It should be noted that, in the figure, the same reference numerals are assigned to the components corresponding to those in Embodiment 1 shown in FIG. 1.

Namely, Embodiment 2 is characterized in that an equalizer 13b is provided for estimating decision value $J_n$ according to a received signal $r'_n$ of which the frequency offset has been corrected, to a CIR estimated value at the first position from the first CIR estimating circuit 12 as well as to an updated value of the CIR estimated value at the first position outputted from the second CIR estimating circuit 14b in place of the equalizer 13 according to Embodiment 1 for estimating decision value $J_n$ according to a received signal $r'_n$ of which the frequency offset has been corrected from the frequency offset correcting circuit, to a CIR estimated value at the first position from the first CIR estimating circuit 12. For this reason, the second CIR estimating circuit 14b is so configured as to successively update, when a CIR estimated value at the second position is to be estimated, a CIR estimated value at the first position as shown in the equation (11) based on the time n and successively output the updated values to a equalizer 13b.

Next description is made for operations of this equalizer 13b, in which this equalizer 13b does not receive an updated value of a CIR estimated value only for the first time from a second CIR estimating circuit 14b, so that the equalizer 13b equalizes a received signal $r'_n$ corrected by the frequency offset correcting circuit 11 according to the CIR estimated values $g_{i,M1}$ outputted from the first CIR estimating circuit 12, and determines a data sequence in the received signal.

Then, as updated values of the CIR estimated values $g_{i,n}$ (n=M1+1, . . . , M2) are successively sent from the second CIR estimating circuit 14b at the second timing and thereafter, the equalizer 13b determines a received signal $r'_n$ corrected by the frequency offset correcting circuit 11 according to the CIR estimated values $g_{i,n}$ (n=M1+1, . . . , M2) successively updated and outputted from the second CIR estimating circuit 14b.

Accordingly, in the receiver with a frequency offset correcting function according to Embodiment 2, the same effect as that in Embodiment 1 can be obtained, and further, when the equalizer 13b determines a data sequence of the transmitted signal, received signals after the second time and on are determined based on successively updated values of the CIR estimated values at the first position successively outputted from the second CIR estimating circuit 14b, so that even when the CIR estimated values varies with time, the variation can be followed, and data can be made decision at a low error rate.

It should be noted that description has been made with an ordinary equalizer 13b as a determining means in Embodiment 2, but a soft-decision equalizer 13a1 for executing soft-decision as shown in FIG. 3 is combined with a hard-decision circuit 13a2 for executing hard decision of a soft-decision value, and the soft-decision equalizer 13a1 may also compute soft-decision values based on the CIR estimated values $g_{i,n}$ successively updated and outputted from the second CIR estimating circuit 14, and similarly to the case of Embodiment 1, design of each components can also be change.

(3) Embodiment 3

Next description is made for a receiver with a frequency offset correcting function according to Embodiment 3 of the present invention.

Figure 12:
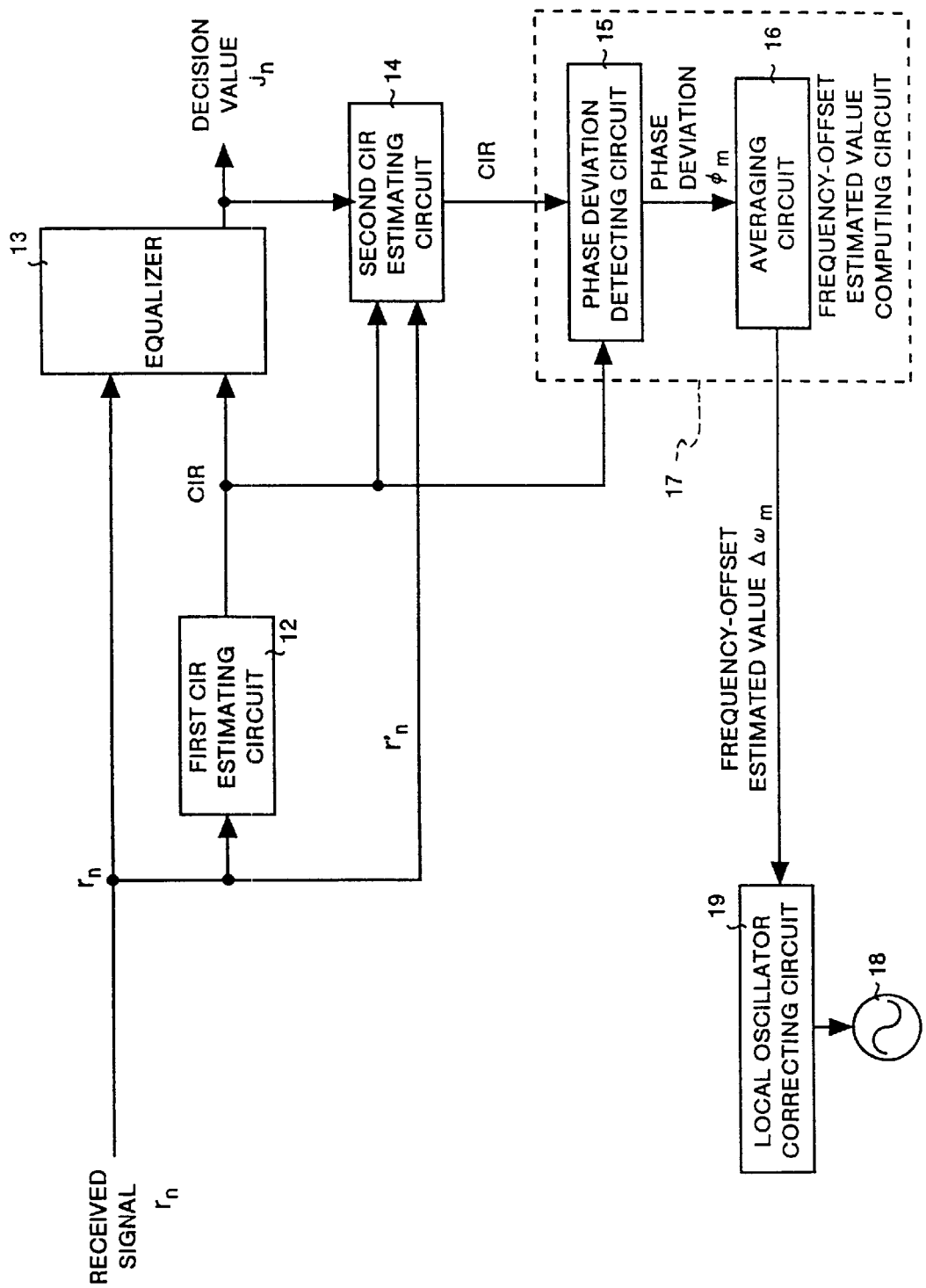
FIG. 12 is a block diagram showing configuration of a receiver with a frequency offset correcting function according to Embodiment 3 of the present invention.

FIG. 12 shows configuration of the receiver with a frequency offset correcting function according to Embodiment 3. It should be noted that, in the figure, the same reference numerals are assigned to the components corresponding to those in Embodiment 1 shown in FIG. 1.

In the figure, Embodiment 3 is characterized in that a local oscillator correcting circuit 19 is provided for correcting a frequency from a local oscillator 18 of the receiver with a frequency-offset estimated value outputted from the averaging circuit 16 in place of correcting frequency offset of the received signal in the frequency offset correcting circuit 11. For this reason, with Embodiment 3, the same effect as that of Embodiment 1 can be obtained.

(4) Embodiment 4

Next description is made for a receiver with a frequency offset correcting function according to Embodiment 4 of the present invention.

Figure 13:
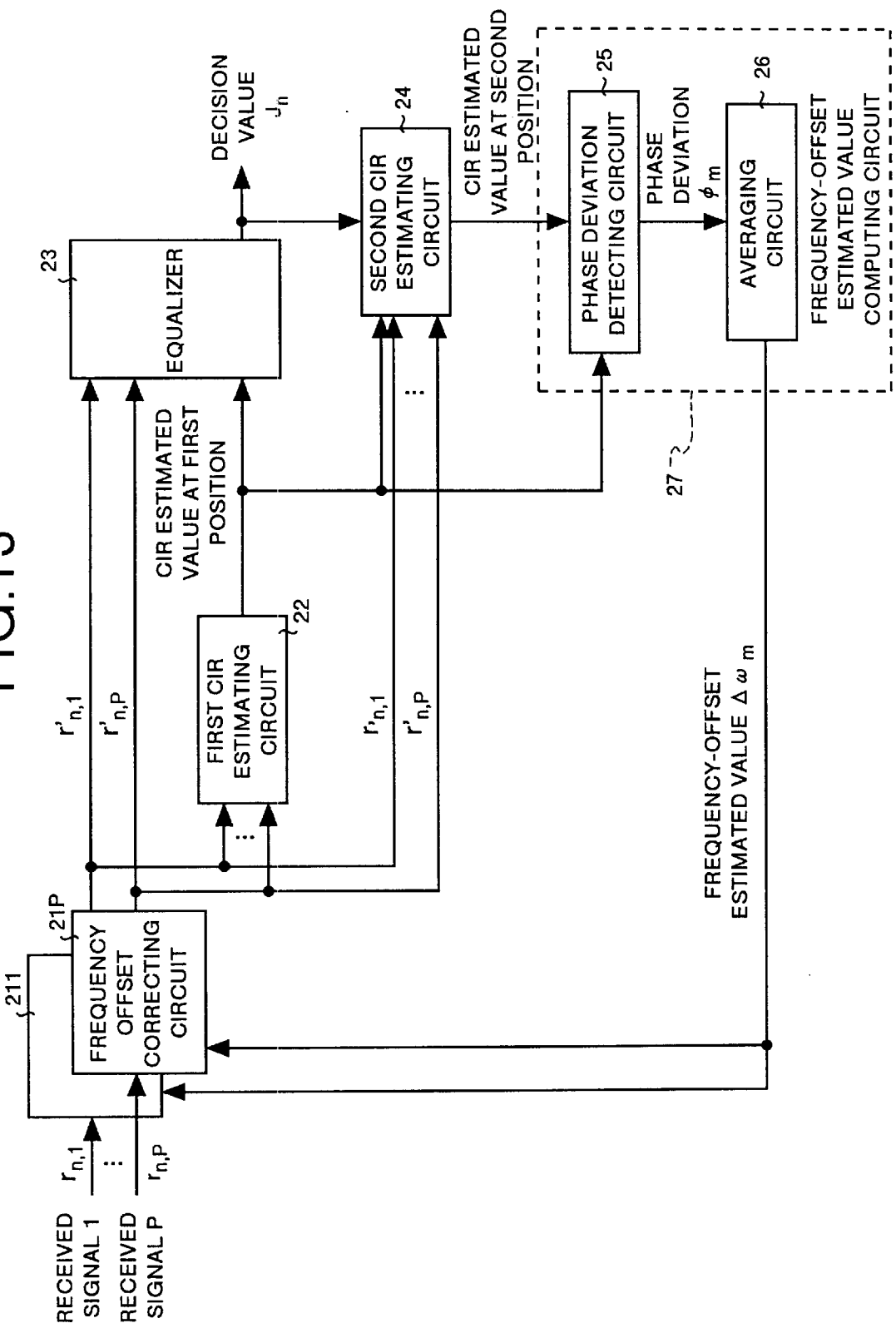
FIG. 13 is a block diagram showing configuration of a receiver with a frequency offset correcting function according to Embodiment 4 of the present invention.

FIG. 13 is a block diagram showing an example of the receiver with a frequency offset correcting function according to Embodiment 4.

In the figure, designated at the reference numeral 211 to 21P (P: an arbitrary natural number) are P-units of frequency offset correcting circuits for receiving received signals $r_{n,1}$ to $r_{n,p}$ and correcting the received signals $r_{n,1}$ to $r_{n,p}$ based on frequency offset estimated values $\Delta\omega_m$ respectively; at 22 a first CIR estimating circuit for estimating CIR at the first position on a burst according to a training sequence in P-pieces of received signals $r'_{n,1}$ to $r'_{n,p}$ corrected by the P-units of frequency offset correcting circuit 21 respectively; at 23 an equalizer for estimating data sequence in the received signals according to the received signals $r'_{n,1}$ to $r'_{n,p}$ corrected by the frequency offset correcting circuits 211 to 21P as well as to each CIR estimated value at the first position estimated by the first CIR estimating circuit 22, and estimating, when a binary signal, for instance, 1 or −1 is transmitted, which value of 1 and −1 is transmitted; at 24 a second CIR estimating circuit for estimating each CIR estimated value at a second position apart from the first position on the burst according to the received signal $r'_{n,1}$ to $r'_{n,p}$ corrected by the frequency offset correcting circuits 211 to 21P, each CIR estimated value at the first position estimated by the first CIR estimating circuit 22, and to a result of decision in the equalizer 23; at 25 a phase deviation detecting circuit for computing a phase deviation according to the CIR estimated value at the first position estimated by the first CIR estimating circuit 22 as well as to the CIR estimated value at the second position estimated by the second CIR estimating circuit 24, and at 26 an averaging circuit for averaging the phase deviations detected by the phase deviation detecting circuit 25 and computing a frequency offset estimated value. It should be noted that the phase deviation detecting circuit 25 and averaging circuit 26 constitute a frequency-offset estimated value computing circuit 27.

Next description is made for operations of the receiver with a frequency offset correcting function according to Embodiment 4. It should be noted that a received signal comprises the burst B2 shown in FIG. 2 described in Embodiment 1, namely the training sequence B21 and the data sequence B22, and it is assumed that the burst B2 of which the training sequence B21 has been known by the receiver is received.

At first, in Embodiment 4, the frequency offset correcting circuits 211 to 21P correct P-pieces of received signals $r_{n,p}$ respectively based on frequency-offset estimated values $\Delta\omega_{m-1}$ through the following equation.

$$r'_s = r_{n,p} \exp(-j\Delta\omega_{m-1} n) \qquad (23)$$

Wherein, p indicates as follows: p=1, ..., P

Then, the first CIR estimating circuit 22 computes CIR estimated values $g_{0,\,n,p},\,g_{1,\,n,p},\,\ldots,\,g_{L,\,n,\,p}$ with the LMS algorithm according to each known training sequence $I_n$ as well as to each training sequence in the corrected P-pieces of received signals $r'_{n,p}$. It should be noted that the LMS algorithm is as follows.

$$g_{i,n,\,p} = g_{i,\,n-1,\,p} + \alpha\{r'_{n,\,p} - \Sigma g_{j,\,n-1,\,p} I_{n-j}\} I_{n-i}^* \qquad (24)$$

Wherein, i, p and n indicate as follows: i=0, ..., L, p=1, ..., P, and n=L+1, ... M1. Also, the sum $\Sigma$ is obtained for j=0, ..., L. The reference sign a indicates a step size of the LMS algorithm, and initial values $g_{0,\,L,p},\,g_{1,\,L,p},\,\ldots,\,g_{L,\,L,p}$ of the CIR estimated values are set to arbitrary values respectively. It should be noted that the reference sign M1 indicates a time corresponding to the final symbol of the training sequence.

Then, the equalizer 23 determines a data sequence according to the CIR estimated values $g_{0,M1,\,p},\,g_{1,M1,\,p},\,\ldots,\,g_{L,\,M1,p}$ for P-pieces of received signal $r'_{n,p}$ corrected and outputted from the first CIR estimating circuit 22 as well as to the corrected P-pieces of received signal $r'_{n,p}$ and outputs a result of the decision as a decision value $J_n$.

Then, the second CIR estimating circuit 24 updates the CIR estimated values $g_{0,\,n,p},\,g_{1,\,n,p},\,\ldots,\,g_{L,\,n,p}$ with the LMS algorithm according to the corrected received signals $r'_{n,p}$ as well as to the decision value $J_n$ outputted from the equalizer 23 with the CIR estimated values $g_{0,M1,\,p},\,g_{1,M1,\,p},\,\ldots,\,g_{L,M1,\,p}$ outputted from the first CIR estimating circuit 22 as initial values. It should be noted that updating is executed with the following equation:

$$g_{i,\,n,\,p} = g_{i,\,n-1,\,p} + \alpha\{r'_{n,\,p} - \Sigma g_{j,\,n-1,\,p} J_{n-j}\} J_{n-i}^* \qquad (25)$$

wherein i, p and n indicate as follows: i=0, ..., L, p=1, ..., P, and n=M1+1, ... M2. Also, the sum $\Sigma$ is obtained for j=0, ..., L. As for $J_n$ in $n \leq M1$, a training sequence $I_n$ is used in place of a decision value $J_n$.

Then, the phase deviation detecting circuit 25 detects a phase deviation according to the series described below. At first, any CIR estimated value of which the absolute value is maximum is selected as a tap coefficient among the CIR estimated values $g_{0,M1,\,p},\,g_{1,\,M1,p},\,\ldots,\,g_{L,\,M1,\,p}$ outputted from the first CIR estimating circuit 22. Herein, it is assumed that a CIR estimated value of which the absolute value is maximum is a tap coefficient $g_{Max,\,M1}$. At the same time, the CIR estimated value $g_{Max,M2}$ corresponding to the tap coefficient $g_{Max,M1}$, namely i and p of which is the same between the coefficients, is selected among the CIR estimated values $g_{0,M2,\,p},\,g_{1,M2,\,p},\,\ldots,\,g_{L,M2,\,p}$ outputted from the second estimating circuit 24, and a phase deviation $\Phi_m$ on a complex plane is computed with the following equation:

$$\Phi_m = g_{Max,\,M2} \cdot g_{Max,\,M1}^* \qquad (26)$$

Herein, a* indicates a complex conjugate of a complex number a.

Then, further, the phase deviation $\Phi_m$ on the complex plane is converted to a phase deviation $\Phi_m$ on polar coordinates with the following equation:

$$\Phi_m = Im[\Phi_m]/Re[\Phi_m] \qquad (27)$$

Then, the averaging circuit 26 divides the phase deviation $\phi_m$ outputted from the phase deviation detecting circuit 25 by (M2−M1) to compute the phase deviation $\Delta\phi_m$ per symbol.

$$\Delta\phi_m = \phi_m/(M2-M1) \qquad (28)$$

Further, the averaging circuit 26 averages the phase deviation $\Delta\phi_m$ per symbol with a FIR filter expressed with the first term of the following equation, and outputs a result of the equation (29) as the frequency-offset estimated value $\Delta\omega_m$ to the frequency offset correcting circuits 211 to 21P.

$$\Delta\omega_m = \Sigma\Delta\phi_{m-j}/Q + \Delta\omega_{m-1} \qquad (29)$$

wherein the sum $\Sigma$ is obtained for j=1, ..., Q.

Then, each of the P-units of frequency offset correcting circuits 211 to 21P corrects each of received signals $r_{n,\,p}$ based on the frequency-offset estimated value $\Delta\omega_m$ from the averaging circuit 16 through the equation (23) respectively.

As described above, with Embodiment 4 of the present invention, frequency offset is estimated without using known data such as tail bits other than the training sequence, and data can be determined while distortion of the frequency offset is compensated, so that, similarly to the case of Embodiment 1, the need for the known data such as tail bits other than the training sequence can be eliminated, transmission efficiency can be improved, even when frequency offset varies with time, the variation can be followed, time-varying frequency offset can be estimated with high precision, and further frequency offset can be corrected with a frequency-offset estimated value with less noise element.

Also, in Embodiment 4, a plurality of frequency offset correcting circuits 211 to 21P are provided, and each data sequence for a plurality of received signals $r_{n,\,p}$ is determined with the equalizer 23, so that diversity reception can be realized and a error rate of determined data can be reduced.

Industrial Applicability

As described above, with the receiver with a frequency offset correcting function according to the present invention, CIR estimated values at first and second positions are obtained according to a known training sequence in a received signal, and a frequency-offset estimated value can be computed according to those phase deviations, so that frequency offset of the received signal can be corrected without using known data such as tail bits other than the training sequence, and data in the received signal can be determined.

As a result, the need for tail bits constituting a burst structure of the received signal is eliminated, so that transmission efficiency can be improved, and also phase deviations are not computed based on estimated values (replica) or the like only according to tail bits in a transmitted sequence but can be computed based on a channel impulse response estimated by sufficiently suppressing a noise element with an appropriate algorithm (LMS algorithm or the like), and for this reason large variation in a detected phase deviation due to noises can be eliminated, time-varying frequency offset can be compensated with high precision, and also data can be determined at a low error rate.

Also, determination of received signals at the second time and thereafter in a determining means can be made-based on values, obtained by successively updating a CIR estimated value at the first position, outputted from the second estimating means, so that even when the CIR estimated value varies with time, determination can follow the variations, which allows data to be determined at a low error rate.

Also, as a frequency from a local oscillator of a receiver is directly controlled in place of correcting frequency offset of a received signal, so that the need for a frequency offset correcting circuit is eliminated, which allows configuration of a circuit for the receiver to be simple.

Also, as a plurality of received signals are received by a plurality of frequency offset correcting circuits respectively, diversity reception can be performed, which allows data to be determined at a low error rate.

In addition, decision including reliability is made with a soft-decision equalizer, which allows the reliability to be utilized in forward error correction and so on.

What is claimed is:

1. A receiver with a frequency offset correcting function comprising:
    a frequency offset correcting means for receiving a received signal as well as a frequency-offset estimated value, and correcting phase rotation due to frequency offset of said received signal according to said frequency-offset estimated value;
    a first channel impulse response estimating means for estimating channel impulse response value at a first position of said corrected received signal according to a known training sequence included in the received signal corrected by said frequency offset correcting means;
    a determining means for determining said received signal corrected by said frequency offset correcting means according to said channel impulse response estimated value at the first position thereof estimated by said first channel impulse response estimating means;
    a second channel impulse response estimating means for estimating channel impulse response value at a second position different from said first position of said corrected received signal according to said received signal corrected by said frequency offset correcting means, said channel impulse response estimated value at the first position thereof estimated by said first channel impulse response estimating means, and to the value determined by said determining means; and
    a frequency-offset estimated value computing means for computing a frequency-offset estimated value of said received signal according to said channel impulse response estimated value at the first position thereof estimated by said first channel impulse response estimating means as well as to said channel impulse response estimated value at the second position thereof estimated by said second channel impulse response estimating means, and outputting the computed value to said frequency offset correcting circuit.

2. A receiver with a frequency offset correcting function comprising:
    a frequency offset correcting means for receiving a received signal as well as a frequency-offset estimated value and correcting phase rotation due to frequency offset of said received signal according to said frequency-offset estimated value;
    a first channel impulse response estimating means for estimating channel impulse response value at a first position of said corrected received signal according to a known training sequence included in the received signal corrected by said frequency offset correcting means;
    a determining means for determining the received signal corrected by said frequency offset correcting means;
    a second channel impulse response estimating means for estimating channel impulse response value at a second position apart from said first position of said corrected received signal by updating said channel impulse response estimated value at the first position according to the received signal corrected by said frequency offset correcting means, said channel impulse response estimated value at the first position thereof estimated by said first channel impulse response estimating means, and to the value determined by said determining means; and
    a frequency-offset estimated value computing means for computing a frequency-offset estimated value of said received signal according to said channel impulse response estimated value at the first position thereof estimated by said first channel impulse response estimating means as well as to said channel impulse response estimated value at the second position thereof estimated by said second channel impulse response estimating means, and outputting the computed value to said frequency offset correcting circuit; wherein
    said determining means determines the received signal corrected by said frequency offset correcting means, for a first time according to said channel impulse response estimated value at the first position thereof estimated by said first channel impulse response estimating means, and determines the received signal corrected by said frequency offset correcting means, after the first time, according to a value updated from said channel impulse response estimated value at the first position thereof by said second channel impulse response estimating means.

3. A receiver with a frequency offset correcting function comprising:
    a first channel impulse response estimating means for estimating channel impulse response value at a first position of said received signal according to a known training sequence included in the received signal;
    a determining means for determining the received signal according to said channel impulse response estimated value at the first position thereof estimated by said first channel impulse response estimating means;
    a second channel impulse response estimating means for estimating channel impulse response value at a second position apart from said first position of said received signal according to the received signal, said channel impulse response estimated value at the first position thereof estimated by said first channel impulse response estimating means, and to the value determined by said determining means;

a frequency-offset estimated value computing means for computing a frequency-offset estimated value of said received signal according to said channel impulse response estimated value at the first position thereof estimated by said first channel impulse response estimating means as well as to said channel impulse response estimated value at the second position thereof estimated by said second channel impulse response estimating means; and a local oscillator correcting means for correcting a frequency from a local oscillator according to the frequency-offset estimated value computed by said frequency-offset estimated value computing means.

4. A receiver with a frequency offset correcting function comprising:

a frequency offset correcting means for receiving a plurality of received signals as well as frequency-offset estimated value, and correcting each phase rotation due to frequency offset for said plurality of received signals according to said frequency-offset estimated value respectively;

a first channel impulse response estimating means for estimating each channel impulse response at a first position of said plurality of corrected received signals according to each known training sequence included in said plurality of received signals corrected by said frequency offset correcting means;

a determining means for determining said plurality of received signals corrected by said frequency offset correcting means according to said channel impulse response estimated values each at the first position thereof estimated by said first channel impulse response estimating means;

a second channel impulse response estimating means for estimating each channel impulse response at a second position apart from the first position of the plurality of corrected received signals according to said plurality of received signals corrected by said frequency offset correcting means, each channel impulse response estimated value at the first position of said plurality of corrected received signals estimated by said first channel impulse response estimating means, and to the value of said plurality of received signals determined by said determining means; and a frequency-offset estimated value computing means for computing frequency-offset estimated value of said plurality of received signals according to each channel impulse response estimated value at the first position thereof estimated by said first channel impulse response estimating means as well as to each channel impulse response estimated value at the second position thereof estimated by said second channel impulse response estimating means, and outputting the computed value to said frequency offset correcting circuit.

5. A receiver with a frequency offset correcting function according to claim 1; wherein the frequency-offset estimated value computing means comprises:

a phase deviation detecting means for detecting a phase deviation between said first position and said second position according to the channel impulse response estimated value at the first position estimated by the first channel impulse response estimating means as well as to the channel impulse response estimated value at the second position estimated by the second channel impulse response estimating means; and an averaging means for averaging phase deviations obtained by computing a phase deviation per symbol according to the phase deviation between said first position and said second position detected by said phase deviation detecting means to compute a frequency-offset estimated value, and outputting the computed value to the frequency offset correcting circuit.

6. A receiver with a frequency offset correcting function according to claim 5; wherein the phase deviation detecting means:

selects a value of which the absolute value is maximum among the channel impulse response estimated values at the first position estimated by the first channel impulse response estimating means, and also selects a value corresponding to said channel impulse response estimated value at the first position of which the absolute value is maximum among the channel impulse response estimated values at the second position estimated by the second channel impulse response estimating means; and detects a phase deviation of the received signal according to the product of complex conjugate of said channel impulse response estimated value at the first position of which the absolute value is maximum and said channel impulse response estimated value at the second position corresponding to the channel impulse response estimated value at the first position of which the absolute value is maximum.

7. A receiver with a frequency offset correcting function according to claim 5; wherein the phase deviation detecting means:

computes each product of the complex conjugate of the channel impulse response estimated value at the first position estimated by the first channel impulse response estimating means and the channel impulse response estimated value at the second position estimated by the second channel impulse response estimating means, and detects a phase deviation of the received signal according to the sum of the products each of which the absolute value is more than a threshold value among the computed products.

8. A receiver with a frequency offset correcting function according to claim 5; wherein the phase deviation detecting means:

computes each product of the complex conjugate of the channel impulse response estimated value at the first position estimated by the first channel impulse response estimating means and the channel impulse response estimated value at the second position estimated by the second channel impulse response estimating means, selects each product of which the absolute value is more than a threshold value among the computed products, multiplies each of the absolute values to the selected products, and detects the phase deviation of the received signals according to the sum of the multiplied values.

9. A receiver with a frequency offset correcting function according to claim 5; wherein the phase deviation detecting means:

further quantizes the phase deviation of the detected received signal, and outputs a result of the quantization as a phase deviation.

10. A receiver with a frequency offset correcting function according to claim 5; wherein the determining means comprises:
a soft-decision equalizer for executing soft-decision of a data sequence in the corrected received signal according to said received signal corrected by the frequency offset correcting means as well as to the channel impulse response estimated value at the first position estimated by the first channel impulse response estimating means; and
a hard-decision circuit for executing hard decision of the soft-decision value estimated by said soft-decision equalizer and outputting a result of the decision as a decision value of a data sequence in the received signal.

* * * * *

UNITED STATES PATENT AND TRADEMARK OFFICE
CERTIFICATE OF CORRECTION

PATENT NO. : 6,347,126 B1
DATED : February 12, 2002
INVENTOR(S) : Takayuki Nagayasu et al.

It is certified that error appears in the above-identified patent and that said Letters Patent is hereby corrected as shown below:

<u>Title page,</u>
Item [63], Related U.S. Application Data, the following information is missing and should be inserted -- THIS APPLICATION IS A CONTINUATION-IN-PART OF PCT APPLICATION NO. PCT/JP97/00653, FILED ON MARCH 4, 1997. --

Signed and Sealed this

Third Day of September, 2002

*Attest:*

*Attesting Officer*

JAMES E. ROGAN
*Director of the United States Patent and Trademark Office*